United States Patent
Peng et al.

(10) Patent No.: US 9,728,588 B2
(45) Date of Patent: Aug. 8, 2017

(54) PIXEL STRUCTURE FOR OLED DISPLAY AND METAL MASK THEREOF

(71) Applicants: Kunshan Visionox Display Co., Ltd., Kunshan (CN); Kunshan Go-Visionox Opto-Electronics Co., Ltd., Kunshan (CN)

(72) Inventors: Chaochi Peng, Kunshan (CN); Yong Qiu, Beijing (CN); Shenfu Zhang, Kunshan (CN)

(73) Assignees: Kunshan Visionox Display Co., Ltd., Kunshan (CN); Kunshan Go-Visionox Opto-Electronics Co., Ltd., Kunshan (CN)

( * ) Notice: Subject to any disclaimer, the term of this patent is extended or adjusted under 35 U.S.C. 154(b) by 131 days.

(21) Appl. No.: 14/762,589

(22) PCT Filed: Dec. 31, 2013

(86) PCT No.: PCT/CN2013/091180
§ 371 (c)(1),
(2) Date: Jul. 22, 2015

(87) PCT Pub. No.: WO2014/114178
PCT Pub. Date: Jul. 31, 2014

(65) Prior Publication Data
US 2015/0364526 A1    Dec. 17, 2015

(30) Foreign Application Priority Data
Jan. 24, 2013 (CN) .......................... 2013 1 0026524

(51) Int. Cl.
*H01L 27/32* (2006.01)

(52) U.S. Cl.
CPC ...... *H01L 27/3218* (2013.01); *H01L 27/3216* (2013.01); *H01L 27/3211* (2013.01)

(58) Field of Classification Search
CPC ............. H01L 27/3211; H01L 27/3216; H01L 27/3218
See application file for complete search history.

(56) References Cited

U.S. PATENT DOCUMENTS

2006/0087226 A1    4/2006  Miura et al.
2006/0267490 A1   11/2006  Hong et al.
(Continued)

FOREIGN PATENT DOCUMENTS

CN    1917228 A    2/2007
CN  101752407 A    6/2010
(Continued)

*Primary Examiner* — Marcia Golub-Miller
(74) *Attorney, Agent, or Firm* — The Webb Law Firm

(57) ABSTRACT

A pixel structure for OLED display is disclosed. The pixel structure includes multi-row pixel unit groups, each pixel unit group includes a plurality of pixel units arranged repeatedly in sequence, and each pixel unit includes a first sub pixel, a second sub pixel and a third sub pixel, wherein the same sub pixels of the pixel units in adjacent two rows are arranged in dislocation in a horizontal direction. The pixel structure can widen the distance between the corresponding openings of the sub pixels when making the corresponding metal mask to enhance the strength of the metal mask that a pixel unit of a smaller size can be produced under the consideration of process condition, so as to improve the resolution of the OLED display.

12 Claims, 13 Drawing Sheets

(56) References Cited

U.S. PATENT DOCUMENTS

| | | | |
|---|---|---|---|
| 2009/0322215 A1 | 12/2009 | Sung et al. | |
| 2011/0128262 A1 | 6/2011 | Chaji et al. | |
| 2011/0291550 A1 | 12/2011 | Kim et al. | |
| 2012/0295508 A1 | 11/2012 | Sung et al. | |
| 2016/0240593 A1* | 8/2016 | Gu | G09G 3/3225 |
| 2016/0329385 A1* | 11/2016 | Qiu | H01L 27/3218 |

FOREIGN PATENT DOCUMENTS

| | | |
|---|---|---|
| CN | 102262854 A | 11/2011 |
| CN | 103123927 A | 5/2013 |
| CN | 203260585 U | 10/2013 |

\* cited by examiner

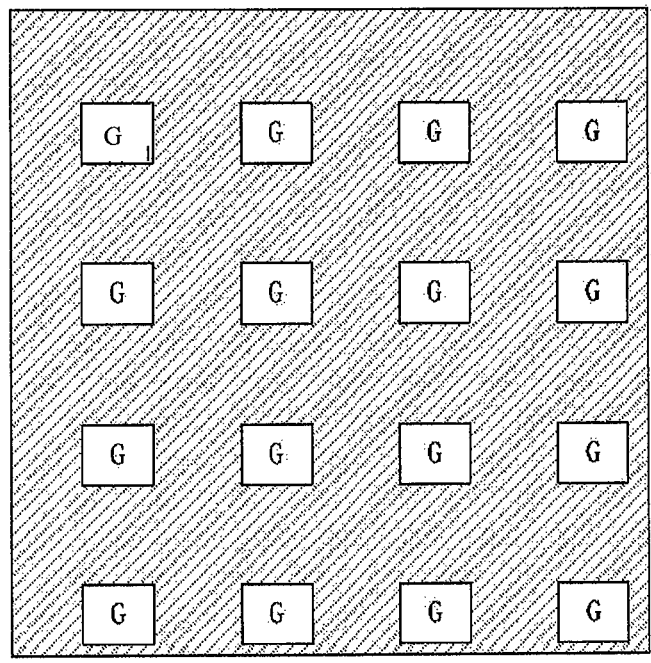
Fig. 5    (Prior Art)
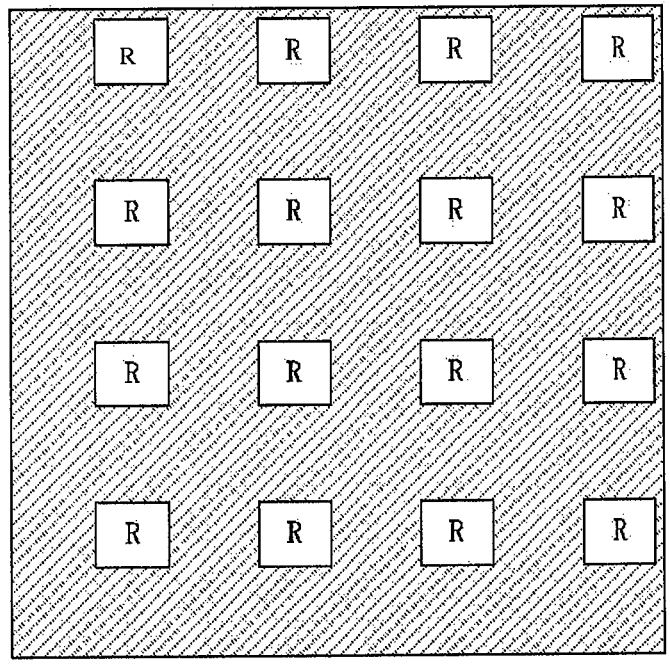
Fig. 6    (Prior Art)

PIXEL STRUCTURE FOR OLED DISPLAY AND METAL MASK THEREOF

CROSS-REFERENCE TO RELATED APPLICATIONS

This application is the United States national phase of International Application No. PCT/CN2013/091180 filed Dec. 31, 2013, and claims priority to Chinese Patent Application No. 201310026524.3 filed Jan. 24, 2013, the disclosures of which are hereby incorporated in their entirety by reference.

FIELD OF THE INVENTION

The present disclosure relates generally to the field of display technique, and specifically to a high resolution pixel structure and a fine metal mask corresponding to the pixel structure.

BACKGROUND OF THE INVENTION

Compared with traditional LCD display mode, it is not necessary for OLED display technique to use backlights. The OLED display technique has the property of self-illumination, a very thin organic material film and a glass substrate are used, and the organic material can glow when an electric current passes through it. Therefore an OLED display can provide significant power savings, can be lighter and thinner, and can tolerate a wider range of temperature variation than LCDs, with a wider viewing angle. The light-emitting layer of the OLED screen is composed by organic light-emitting components formed on corresponding pixel locations on an array substrate by using evaporation film technology to organic materials through a fine metal mask. The OLED screen should be colorized for color display. The side-by-side mode has the best effect on colorized screen. In the side-by-side mode, there are red, green and blue (R, G and B) three sub pixels in a pixel, and every sub pixel has an independent light-emitting component. Because the organic light-emitting materials of red, green and blue three sub pixels are different, in the production process, it needs to evaporate three different kinds of organic materials to red, green and blue three-color light-emitting sub pixels on the corresponding locations by a metal mask, and the color-ratio of the combination of the three colors is adjusted to create true color. In this way, the red, green and blue constitute three-color OLED components emit light independently to form a pixel.

The production of the pixel per inch (PPI) OLED screen has focused on fine metal mask with good mechanical stability, and the key to the fine metal mask is the arrangement of pixels and sub pixels.

According to the arrangement of the pixel array, there are a few kinds of opening methods of the metal mask existing in industry as follows.

Slit Mode

FIG. 1 shows a traditional pixel arrangement arranged side by side. The light-emitting layer of the OLED display is composed by pixel cells 100 arranged on a substrate 10 in multi-row and multi-column. For the pixel arrangement as shown in FIG. 1, there are red (R) 102, green (G) 103 and blue (B) 100 three sub pixels parallel to each other in one pixel cell 100. In order to form the pixel arrangement, the corresponding metal mask is shown in FIG. 2.

FIG. 2 shows a metal mask used to form one of the sub pixels (R sub pixel) in the pixel structure as shown in FIG. 1 on the OLED display substrate. It will be appreciated that the rest sub pixels (G and B) can be formed by a metal mask having the same above structure due to each sub pixel having the same patterning.

The metal mask includes a metal substrate 20 and a rectangular opening 200 thereon. Wherein, the number of the opening can be determined by the number of the pixel required by the resolution of the OLED display. FIG. 2 shows four columns of openings 200. A section 201 between adjacent two openings 200 forms an unopened metal strip of the metal substrate 20. As shown in FIG. 1, the opening method of the metal mask is that one opening 200 is shared by all the sub pixels in the same column (for example, R sub pixels) in the OLED screen. Thus the opening 200 of the metal mask is relative long in length. With the increase in display size, the length of the opening of the metal mask needs to be increased.

This shows Slit Mode is easy to make and use the metal mask for low-resolution OLED screens due to which the number of pixels is small that the space between adjacent openings 200 is relative large, i.e., the width of the metal strip is relative wide.

However, the above opening mode needs a fine metal mask when used for a high resolution screen. The space between adjacent openings 200 is reduced for the increase in the number of pixels, i.e., the metal strip 201 is relative fine. This creates a problem that the metal strip is likely to be out of shape under the influence of magnetic field lines of the magnetic board during the use of the metal mask, resulting in color mixing caused by the spread of different color materials in among pixels, and resulting in low yield during production. Moreover, this kind of metal mask is easy to be damaged or deformed in the process of using, cleaning and storing, with a low repetitive use rate, and the screen produced by this mode has a high cost due to the high cost of the metal mask.

Slot Mode

In view of the above problem, a metal mask solution with a slot is provided, as shown in FIG. 3, to form the arrangement of pixels as shown in FIG. 1. As FIG. 3, the opening mode of the metal mask is that based on Slit Mode the locations corresponding to the spaces between the sub pixels as shown in FIG. 1 and corresponding to the openings 200 as shown in FIG. 2 are provided with metal bridges 301 connecting adjacent metal strips, so that one long opening 200 as show in FIG. 2 is changed into a plurality of openings units 300 corresponding to the sub pixel structure as shown in FIG. 1.

This opening mode makes the metal strip of the metal mask stronger to resolve the above problem that the metal strip is likely to be out of shape under the influence of magnetic field lines and external force in Slit Mode. However in view of the precision of long size of the metal mask that adequate distance must be maintained between the sub pixel and the bridge in order to avoid shadow effect in sub pixels when evaporation, the reduction in the length between bottoms of the sub pixel will affect the opening rate of every sub pixel.

To solve this problem, a U.S. patent No. 20110128262A1 discloses another pixel structure different from the above pixel structure, as shown in FIG. 4. The pixel structure includes a plurality of pixel units 400 arranged in multi-row and multi-column, each pixel is composed of red, green and blue three sub pixels, where the blue sub pixel has the largest surface area due to fastest attenuation of blue light, while the red and green sub pixels are arranged on one side of the blue sub pixel and respectively arranged on the upper and lower locations along the long side of the blue sub pixel.

The pixel units 400 are arranged repeatedly to form a pixels array. The arrangement of the pixel structure makes the spaces between the openings of the metal mask corresponding to the red and green sub pixels (as FIGS. 5-6) are relatively large that high-resolution display can be achieved to some extent.

However, the blue sub pixels in the pixel array are aligned as FIG. 1, so that their corresponding metal mask must use the opening mode as the above Slit or Slot (as FIG. 7). Because both the above Slit Mode and Slot Mode have defects, the opening mode of the blue metal mask (B mask) of the arrangement of the pixel array as shown in FIG. 4 seriously affects the opening rate of the sub pixel and the resolution further upgrade.

SUMMARY OF THE INVENTION

In view of the above, an object of the disclosure is to provide new arrangements of sub pixels and a pixel array to make the fine metal mask have high mechanical stability and easy to be produced, so as to improved the production of high resolution OLED screen well and reduce production costs.

In order to solve the above technical problem, the present disclosure uses the following technical solution.

According to one aspect of the disclosure, a pixel structure for OLED display includes multi-row pixel unit groups, each pixel unit group includes a plurality of pixel units arranged repeatedly in sequence, and each pixel unit includes a first sub pixel, a second sub pixel and a third sub pixel, wherein the same sub pixels of the pixel units in adjacent two rows are arranged in dislocation in a horizontal direction.

Preferably, the second sub pixel and the third sub pixel are lined up along one of the sides of the first sub pixel in each pixel unit, and the arrangement of the first sub pixel, the second sub pixel and the third sub pixel of the pixel unit of the pixel unit group in an even row is formed by flipping the pixel unit of the pixel unit group in an odd row horizontally to 180°.

Preferably, the second sub pixel and the third sub pixel are lined up along one of the sides of the first sub pixel in each pixel unit, and the pixel unit group in an even row is arranged to be offset by a first distance with respect to the pixel unit group in an odd row in a horizontal direction.

Preferably, the pixel unit group in an even row is arranged to be offset to left by a second distance or be offset to right by a third distance with respect to the pixel unit group in an odd row in a horizontal direction.

Preferably, the first sub pixel, the second sub pixel and the third sub pixel in each pixel unit are arranged in a specified order, and the arrangement of the sub pixels of the pixel unit of an odd row is different from that of an even row.

Preferably, the first sub pixel, the second sub pixel and the third sub pixel in each pixel unit are arranged side by side, and the pixel unit group in an even row is arranged to be offset by a first distance with respect to the pixel unit group in an odd row in a horizontal direction.

Preferably, the pixel unit group in an even row is arranged to be offset to left by a second distance or be offset to right by a third distance with respect to the pixel unit group in an odd row in a horizontal direction.

Preferably, the first sub pixel, the second sub pixel and the third sub pixel are shaped rectangles.

Preferably, the pixel unit has a shape of square, the first sub pixel has a shape of rectangle, the second sub pixel and the third sub pixel are aligned vertically along the long side of the first sub pixel, and the length of the long side of the first sub pixel is larger than two-thirds of the side length of the pixel unit.

Preferably, the area of the first sub pixel is larger than that of the second sub pixel and that of the third sub pixel, and is smaller than half of the area of the pixel unit.

Preferably, the area of the first sub pixel is twice as that of at least one sub pixel of the second sub pixel and the third sub pixel.

Optionally, the area of the second sub pixel or the third sub pixel can be larger than the area of each of the remaining two sub pixels.

Optionally, the area of the second sub pixel or the third sub pixel is twice as that of at least one of the remaining two sub pixels.

Preferably, the scope of the first distance offset in a horizontal direction is to make same sub pixels in adjacent two rows be arranged in dislocation in the horizontal direction.

Preferably, the second distance offset to the left or the third distance offset to the right make same sub pixels in adjacent two rows be arranged in dislocation in a horizontal direction.

Preferably, the scope of the dislocation between the first sub pixels in the pixel unit in an even row and the first sub pixels in the pixel unit in an odd row in a horizontal direction makes the spaces between the first sub pixel in an even row and adjacent two first sub pixels in adjacent odd rows are the same.

Preferably, the first sub pixel is a blue pixel, the second sub pixel is a red pixel, and the third sub pixel is a green pixel.

Optionally, the second or third sub pixel can be a blue pixel, and the remaining two sub pixels are a red pixel and a green pixel.

It is another object of the present disclosure to provide a metal mask for making sub pixels in a pixel structure of OLED display.

According to a further aspect of the disclosure, a metal mask for making sub pixels in a pixel structure of OLED display, includes a substrate including a plurality of openings arranged in turn in rows and columns, where the opening is configured to form the sub pixel and the openings in an even row and the openings in an odd row are arranged in dislocation in a horizontal direction.

Preferably, the distances between the opening in an even row and adjacent two openings in adjacent odd rows are the same.

The further object of the disclosure is to provide an OLED display, which includes any pixel structure as above.

The pixel structure and its corresponding metal mask and OLED display of the present disclosure has the following advantages.

The distance between the corresponding openings of the sub pixels are widened when making the corresponding metal mask to enhance the strength of the metal mask that a pixel unit of a smaller size can be produced under the consideration of process condition, so as to improve the resolution of the OLED display.

BRIEF DESCRIPTION OF THE DRAWINGS

FIG. 5 is a schematic diagram illustrating a structure of a metal mask corresponding to green pixels in the pixel structure as FIG. 4.

FIG. 6 is a schematic diagram illustrating a structure of a metal mask corresponding to red pixels in the pixel structure as FIG. 4.

FIG. 8 (a1) is a schematic diagram illustrating a scope of a first distance in the pixel structure as FIG. 8 (a).

DETAILED DESCRIPTION OF THE INVENTION

In the following description of embodiments, reference is made to the accompanying drawings which form a part hereof, and in which it is shown by way of illustration specific embodiments of the present disclosure that can be practiced. It is to be understood that other embodiments can be used and structural changes can be made without departing from the scope of the disclosed embodiments.

Figure 1:
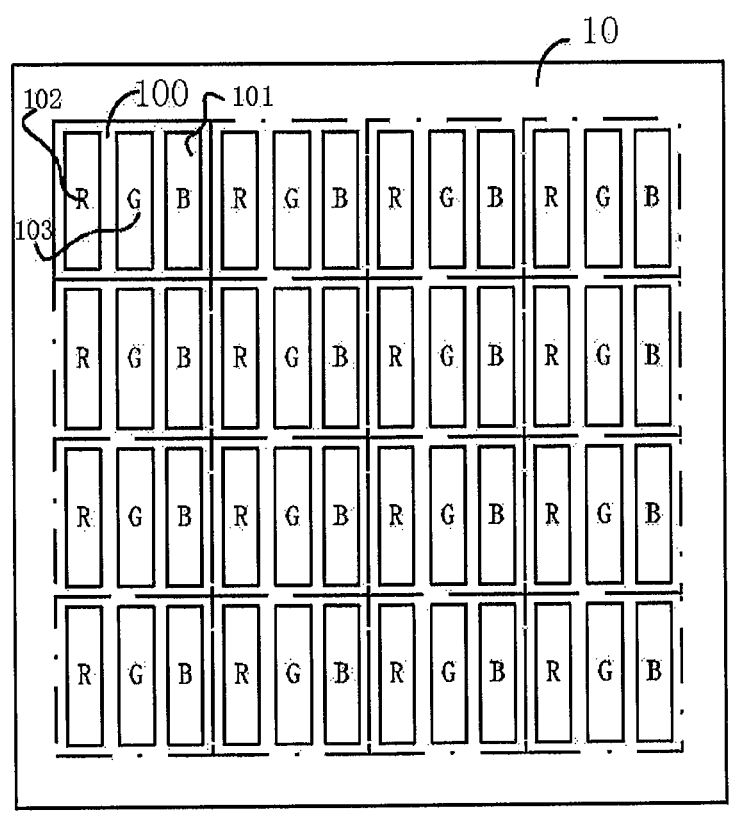
FIG. 1 is a schematic diagram illustrating a traditional Slit Mode for pixel arrangement.
Figure 2:
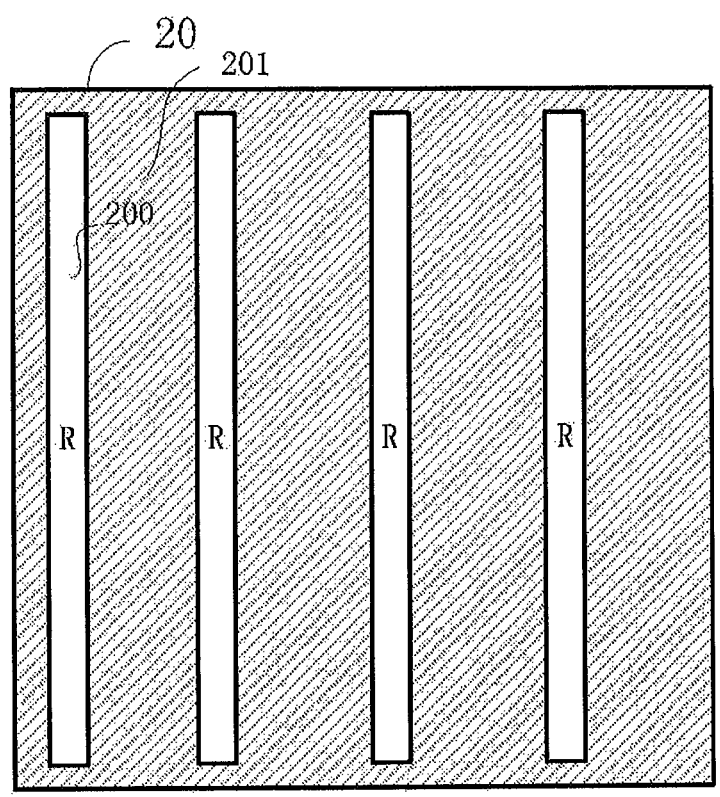
FIG. 2 is a schematic diagram illustrating openings of a metal mask corresponding to Slit Mode.
Figure 3:
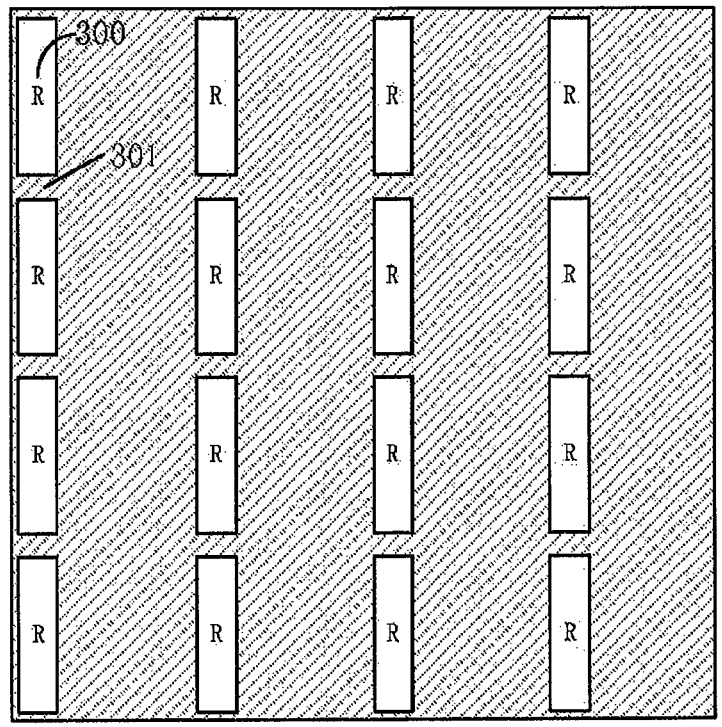
FIG. 3 is a schematic diagram illustrating a structure of a metal mask corresponding to Slit Mode.
Figure 4:
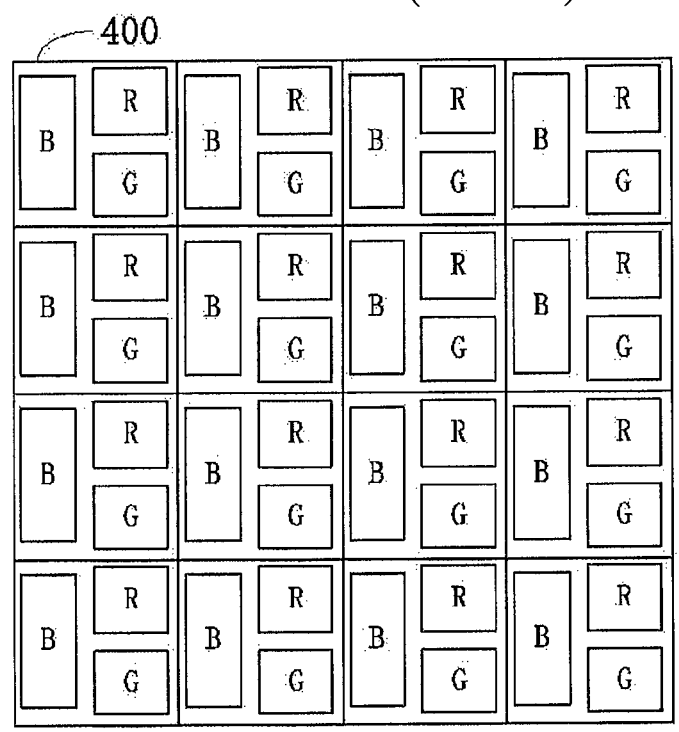
FIG. 4 is a schematic diagram illustrating a pixel structure according to another arrangement in the prior art.
Figure 7:
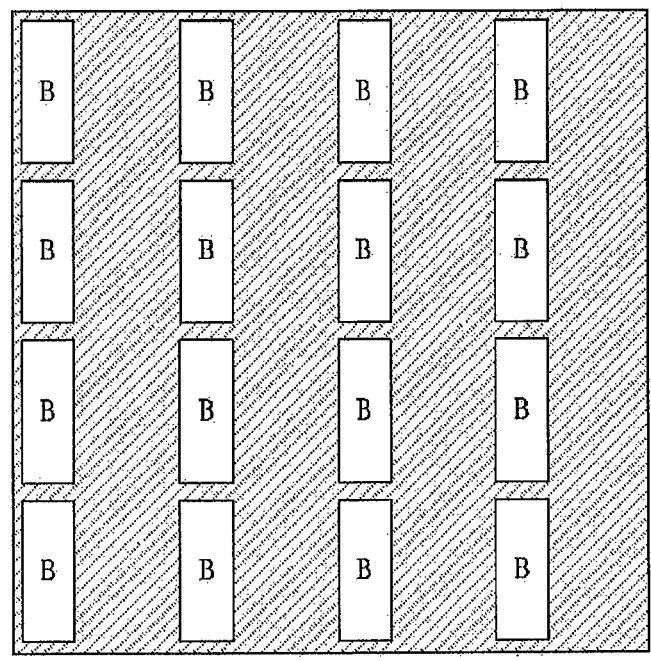
FIG. 7 is a schematic diagram illustrating a structure of a metal mask corresponding to blue pixels in the pixel structure as FIG. 4.
Figure 8A:
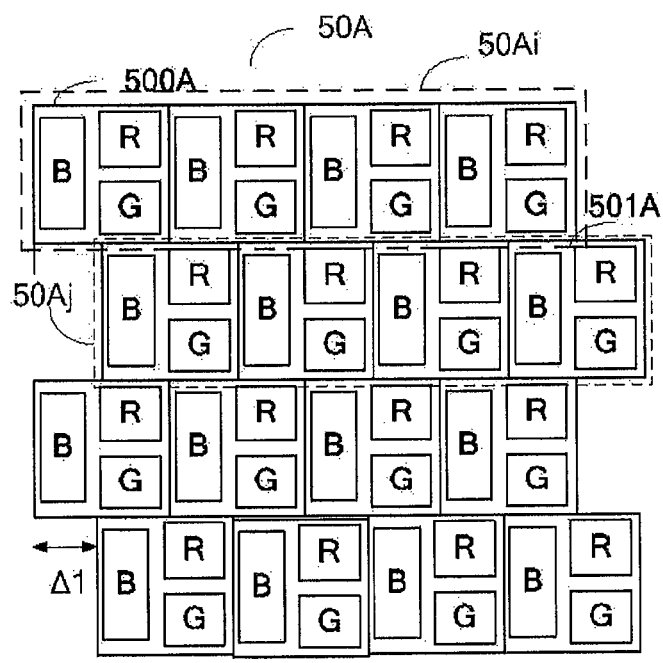
FIGS. 8 (a)-(c) are schematic diagrams illustrating a pixel structure according to one embodiment of the present disclosure.
Figure 8:
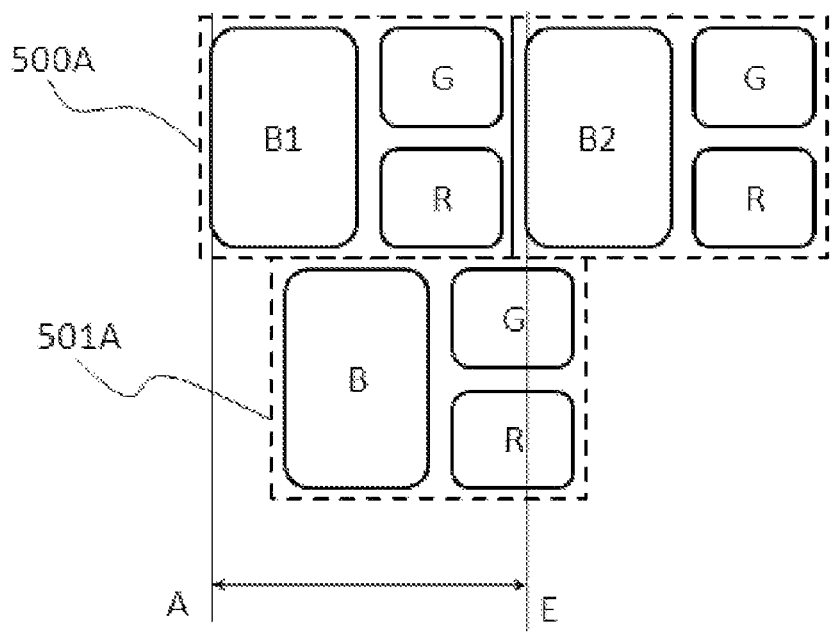
Figure 8B:
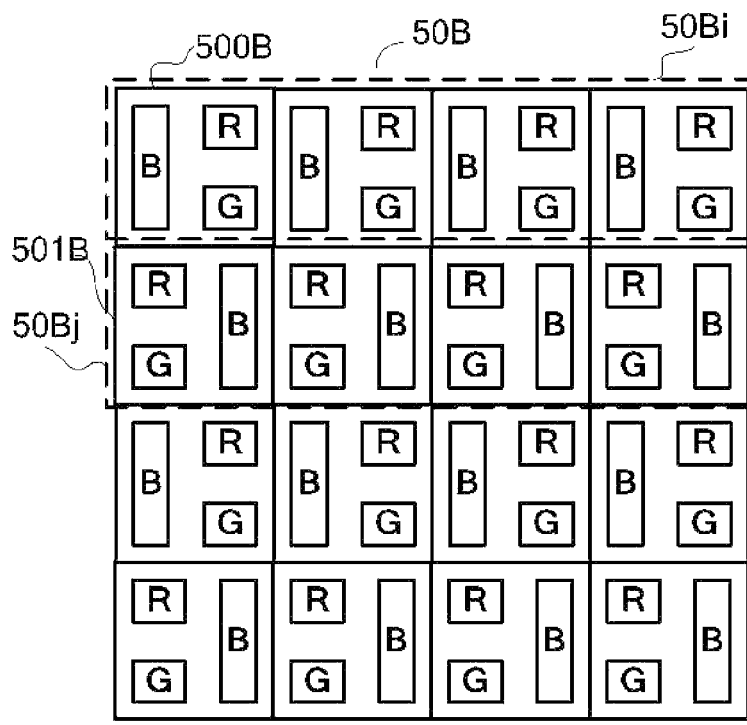
Figure 8C:
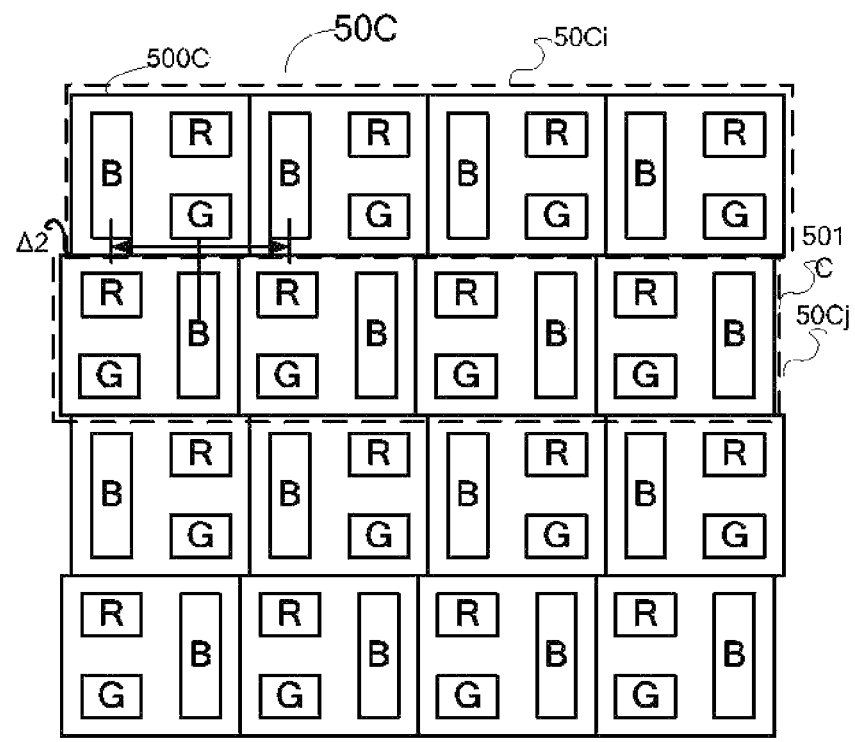

FIGS. 8 (a)-8(c) illustrate a pixel structure of the OLED display according to one embodiment of the present disclosure.

Wherein, a pixel structure 50A is located on a substrate (not shown). The pixel structure 50A includes multi-row pixel unit groups (denoted with the dotted box), a plurality of pixel unit groups in odd rows 50Ai includes pixel units 500A arranged repeatedly, and a plurality of pixel unit groups in even rows 50Aj includes pixel units 501A arranged repeatedly.

Wherein, each pixel unit 500A or 501A can be a square, each pixel unit 500A or 501A includes red (R), green (G), and blue (B) three sub pixels. In one embodiment, each pixel unit can be a rectangle in shape. It's important to note that such square or rectangle described herein is only a general description for the shape of the sub pixel, and in which minor modification may be made in practice, for example, four corners of the square or rectangle can be rounded with a curve, as shown in FIG. 8 (a1).

As shown in FIG. 8(a), the sub pixel such as the blue sub pixel (B) of the pixel unit 500A in an odd row and the sub pixel such as the blue sub pixel (B) of the pixel unit 501A in an even row are arranged in dislocation in a horizontal direction, i.e., they are not aligned in vertical direction. Such pixel structure widens the distance between the corresponding openings of the sub pixels when making the corresponding metal mask to enhance the strength of the metal mask that a pixel unit of a smaller size can be produced under the consideration of process condition, so as to improve the resolution of the OLED display.

Wherein, the three sub pixels in the pixel unit 500A in odd rows or in the pixel unit 501A in even rows can be arranged as that the blue sub pixel (B) is arranged on the left half of the pixel unit 500A or 501A and the red sub pixel (R) and the green sub pixel (G) are lined up along the right side of the blue sub pixel (B) and on the right half of the pixel unit 500A or 501A.

As shown in FIG. 8 (a), the pixel unit 501A of the pixel unit group in an even row and the pixel unit 500A of the pixel unit group in an odd row are arranged in dislocation in a horizontal direction. Namely, the pixel unit group in an even row is arranged to be offset by a first distance Δ1 left or right to the pixel unit group in an odd row in the horizontal direction and arranged closely to the pixel unit group in the odd row.

Wherein, the pixel unit group in an even row arranged to be offset by a first distance Δ1 left or right to the pixel unit group in an odd row makes corresponding sub pixels in adjacent two rows of pixel unit groups are arranged in dislocation in the horizontal direction. The scope of the first distance Δ1 can be less than the distance between adjacent two same sub pixels in the same row.

For example, as shown in FIG. 8 (a1), the distance between left boundaries of the blue sub pixels (B1 and B2) in adjacent two pixel units 500A in the pixel unit group in an odd row is AE, and the scope of the first distance Δ1 can be chosen to a distance less than AE.

In one embodiment, the scope of the first distance Δ1 can be chosen that the left boundary of the blue sub pixel (B) of the pixel unit 501A of the pixel unit group in an odd even is in the vertical center line of AE, i.e., the sub pixel of the pixel unit 501A of the pixel unit group in an odd even is located in the middle position of two same sub pixels of adjacent two pixel units in a adjacent pixel unit group in an odd row.

In this way, the distance between the opening of the corresponding sub pixel in an odd row and the corresponding sub pixel in an even row can be maximized to enhance the strength of the metal mask that a pixel unit of a smallest size can be produced under the consideration of process condition, so as to put more pixel units in a display panel with a certain area to achieve the production of high resolution OLED display.

Wherein, the red, green and blue three sub pixels in the pixel units 500A or 501A can be squares or rectangles. Moreover, the area of the pixel unit 500A or 501A and the three sub pixels can be determined by the resolution of the OLED display demands.

In one embodiment, the areas of the red and green sub pixels are the same, and the distance between the red sub pixel or the green sub pixel and the blue sub pixel are the same. In addition, in one embodiment, suitable area ratios between each sub pixel can be determined by the luminescent capability and life of the organic light-emitting material and white balance. In one embodiment, in view of the blue-light emitting material having low luminescent capability and short life among existing materials and the requirement of white balance, the area of the blue sub pixel is chosen to be larger than the area of the red sub pixel or the green sub pixel.

In one embedment, the blue sub pixel has a shape of rectangle, and the red sub pixel and the green sub pixel are aligned along the long side of the blue sub pixel.

In one embodiment, the length of the long side of the blue sub pixel is larger than two-thirds of the side length of the pixel unit.

In one embodiment, the opening area of the blue sub pixel is about twice as that of the red sub pixel or green sub pixel.

Accordingly, spaces are needed between the blue, red and green pixels, so the area of the blue sub pixel is less than half of the area of the pixel unit 500A or 501A.

Figure 10:
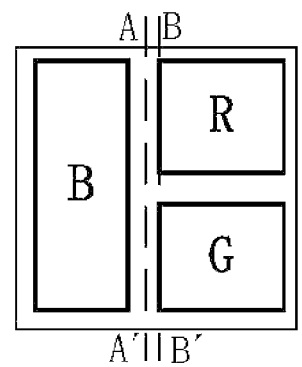
FIG. 10 is a schematic diagram illustrating a location of the blue pixel in the pixel structure as FIG. 8 (a)-(c).

FIG. 10 shows the positional relation between the sub pixels, where B-B' is a vertical center line of the pixel unit, and A-A' is a vertical center line of horizontal spacing between the blue sub pixel and the closest sub pixel thereto of the red and the green sub pixels. Wherein, the vertical center line of horizontal spacing between the blue sub pixel and the closest sub pixel (for example, the red sub pixel) thereto of the red and the green sub pixels A-A' and the blue sub pixel are on the same side of the vertical center line of the pixel unit B-B'. Wherein the locations of A-A' and B-B' in the pixel 500 or 501 do not overlap.

Figure 11A:
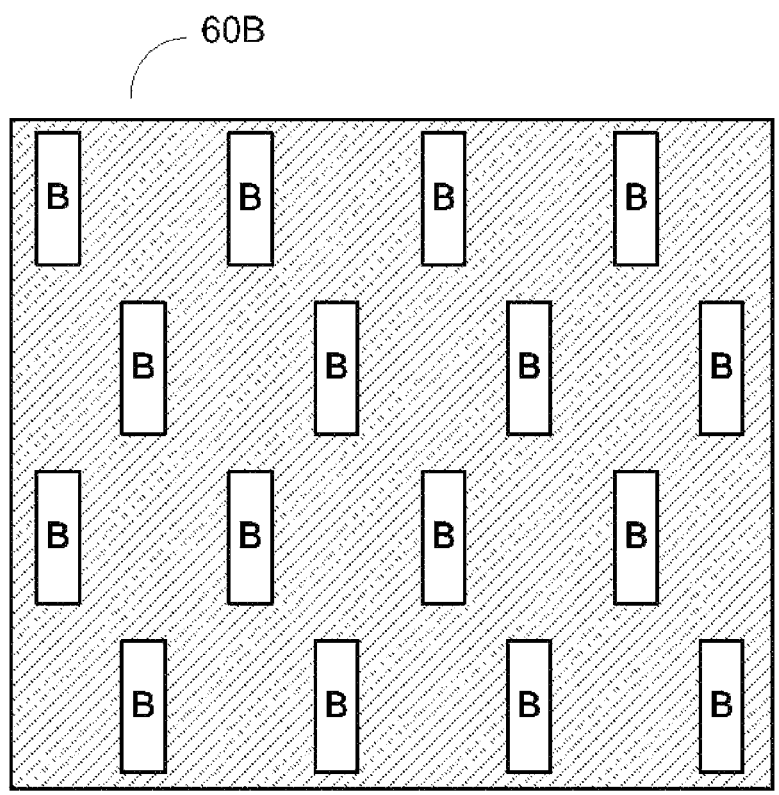
FIGS. 11 (a)-(c) are schematic diagrams illustrating metal masks of sub pixels corresponding to the pixel structure as FIG. 8 (a)-(c).
Figure 11B:
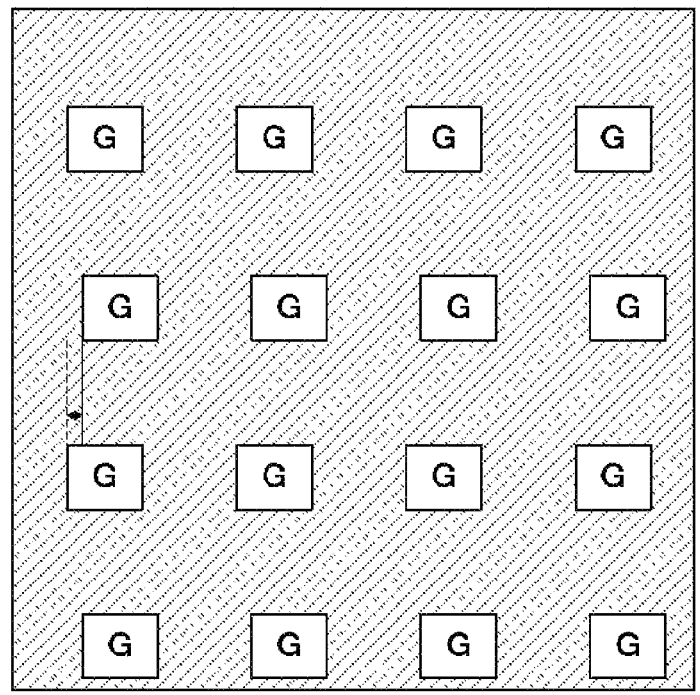
Figure 11C:
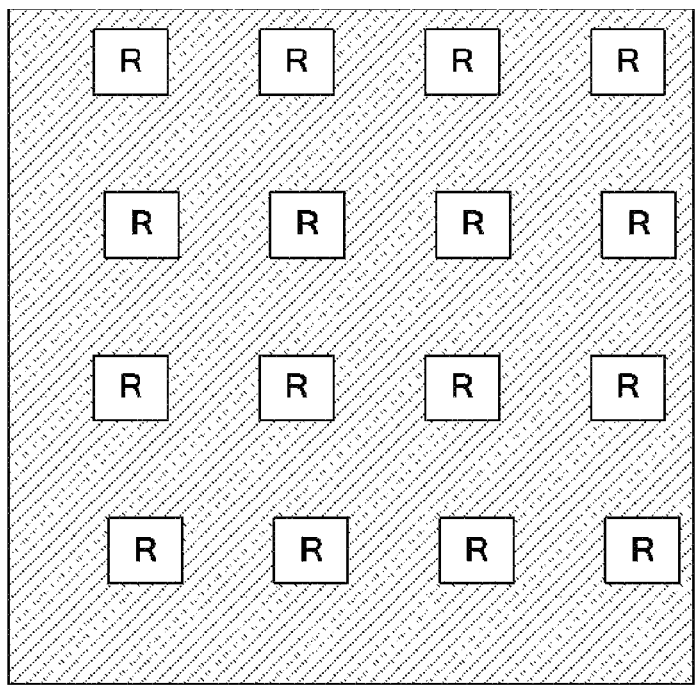

It can be seen that each same sub pixel of every two adjacent rows can be arranged in dislocation in a horizontal direction by arranging the pixel unit group in an even row and the pixel unit group in an odd row to be offset by a first distance in the horizontal direction. In this way, the openings of adjacent rows in the metal mask are arranged in dislocation when creating the metal mask of the sub pixels, such as the metal mask of the blue sub pixels, as FIG. 11a. The arrangement of the openings in the metal mask corresponding to the red sub pixels and the green sub pixels as shown in FIG. 11 (b) and FIG. 11 (c). In this way, the strength of the metal mask can be enhanced. Under the same process conditions, compared with the aligned arrangement of sub pixels in adjacent two rows of pixel unit groups in the prior art, the structure of the sub pixels of adjacent rows arranged in dislocation of the present disclosure widens the available distance between the openings of the same sub pixels that a pixel unit of a smaller size can be produced to achieve the production of the high resolution OLED display.

Figure 12:
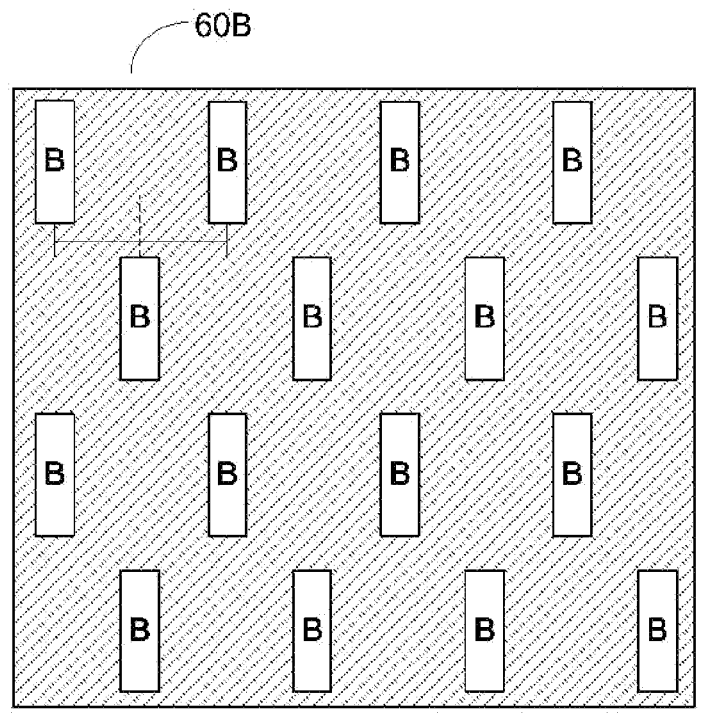
FIG. 12 is a schematic diagram illustrating a metal mask according to an optimal embodiment of the present disclosure.

In one embodiment, the scope of distance offset makes the blue sub pixel in even rows be in the middle of two adjacent blue sub pixels in adjacent two odd rows that the distance between the blue sub pixels in an even row and two adjacent blue sub pixels in an adjacent odd row are the same. The intention of the pixel structure can make the spaces between the adjacent blue sub pixels be maximized. Accordingly, the distances between openings in the metal mask for making blue sub pixels also can be maximized, and as shown in FIG. 12, the distance between the opening B and the opening B is significantly improved to enhance the strength of the metal mask that a pixel unit of a smaller size can be produced under the consideration of process condition, so as to achieve the production of the high resolution OLED display.

FIG. 8 (b) is a schematic diagram illustrating a pixel structure 50B according to another embodiment of the present disclosure.

Figure 9:
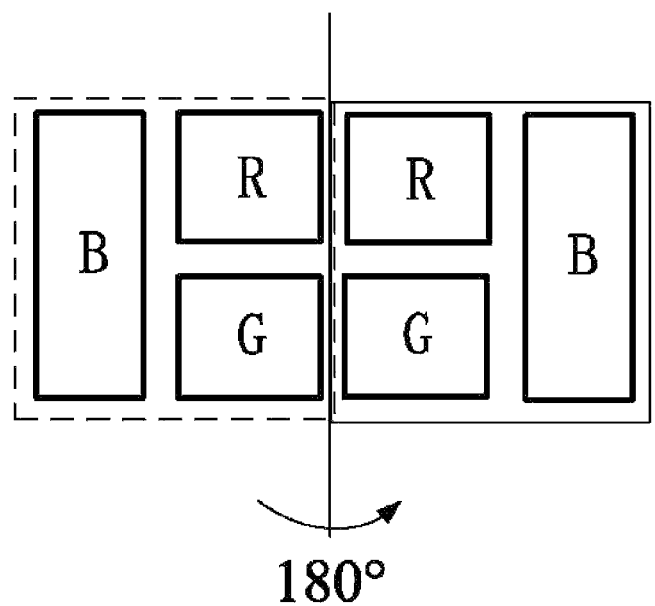
FIG. 9 is a schematic diagram illustrating a pixel unit flipped horizontally from a pixel unit in the pixel structure as FIG. 8 (b).

The difference between the pixel structure shown in FIG. 8 (b) and the pixel structure shown in FIG. 8 (a) is that left and right boundaries of the pixel unit 500B and 501B in the pixel unit group in the odd row 50Bi and the pixel unit group in the even row 50Bj are lined up. And the pixel unit 501B in the even row shown in FIG. 8 (b) is aligned to the pixel unit 500B by flipping the pixel unit 500B in the odd row horizontally to 180°, as shown in FIG. 9, to make the sub pixels in the pixel unit 501B and the sub pixels in the pixel unit 500B be arranged in dislocation in a horizontal direction.

Namely, if the red and green sub pixels in the pixel unit 500B in the odd row are lined up along the right side of the blue sub pixel, the red and green sub pixels in the pixel unit 501B in the even row are lined up along the left side of the blue sub pixel.

In one embodiment, the red, green and blue three sub pixels in the pixel units 500B or 501B can be squares or rectangles.

In one embodiment, the areas of the red and green sub pixels are the same, and the distances between the red sub pixel and the blue sub pixel and between the green sub pixel and the blue sub pixel are the same.

In one embodiment, the blue sub pixel has a shape of rectangle, and the red sub pixel and the green sub pixel are aligned along the long side of the blue sub pixel.

In one embodiment, the length of the long side of the blue sub pixel is larger than two-thirds of the side length of the pixel unit.

In one embodiment, the opening area of the blue sub pixel is about twice as that of the red sub pixel or green sub pixel.

In one embodiment, the area of the blue sub pixel is less than half of the area of the pixel unit 500B or 501B.

It can be seen that each same sub pixel of every two adjacent rows can be arranged in dislocation in a horizontal direction by flipping the sub pixels in each pixel unit in the odd row and the even row horizontally to 180° instead of arranging the pixel unit group in the even row to be offset by a distance with respect to the pixel unit group in the odd row in the horizontal direction. This structure can obtain the benefits of the above structure of the sub pixels of adjacent rows arranged in dislocation, and because the pixel units in the odd row and the pixel unit in the even row (taking the pixel unit as a whole) are aligned, there is no blank area on the edge of the display, so as to achieve a better display effect.

In one embodiment, the openings of adjacent rows in the metal mask are arranged in dislocation by the pixel structure of the above embodiment when making the metal mask corresponding to the sub pixels, such as making the metal mask of the blue sub pixel, as shown in FIG. 10. Similarly, the strength of the metal mask can be enhanced and the production of the high resolution OLED display can be achieved.

FIG. 8 (b) is a schematic diagram illustrating a pixel structure 50C according to a further embodiment of the present disclosure.

Wherein, the difference between the pixel structure shown in FIG. 8 (c) and the pixel structure shown in FIG. 8 (b) is that in the pixel structure 50C the pixel unit group 50Ci in the even row is arranged to be offset by a second distance 42 left (or right) to the pixel unit group 50Cj in the odd row in a horizontal direction and lined up on a adjacent row of the odd row.

In one embodiment, the red, green and blue three sub pixels in the pixel units 500A or 501A can be squares or rectangles.

In one embodiment, the areas of the red and green sub pixels can be the same, and the distance between the red sub pixel or the green sub pixel and the blue sub pixel can be the same.

In one embedment, the blue sub pixel has a shape of rectangle, and the red sub pixel and the green sub pixel are aligned along the long side of the blue sub pixel.

In one embodiment, the length of the long side of the blue sub pixel is larger than two-thirds of the side length of the pixel unit.

In one embodiment, the area of the blue sub pixel is larger than that of the red sub pixel or that of the green sub pixel.

In one embodiment, the opening area of the blue sub pixel is about twice as that of the red sub pixel or green sub pixel.

In one embodiment, the area of the blue sub pixel is less than half of the area of the pixel unit 500A or 501A.

It's important to note that the pixel unit group can be arranged to be offset by a second distance Δ2 to the left and also can be arranged to be offset by a third distance to the right (not shown). FIG. 8 (c) only shows the even row is offset by a second distance Δ2 left to the odd row in a horizontal direction. Wherein, the scope of the second distance and the scope of the third distance make same sub pixels in adjacent two rows be arranged in dislocation in the horizontal direction.

It should be understood that the scope of the second distance and the scope of the third distance are determined by the horizontal distance between the adjacent same sub pixels in the same column of pixels units in adjacent two rows, and can be implemented by arranging the same sub pixels in adjacent two rows in dislocation in a horizontal direction.

In one embodiment, the scope of distance offset makes the blue sub pixel in even rows be in the middle of two adjacent blue sub pixels in adjacent two odd rows that the distance between the blue sub pixels in an even row and two adjacent blue sub pixels in an adjacent odd row are the same, as the positional relation between the blue sub pixels shown in FIG. 8 (c) at double-headed arrow. In this way, the spaces between the adjacent blue sub pixels can be maximized, and the distances between corresponding openings of the sub pixels in the metal mask can be maximized when making the pixel structure, so as to enhance the strength of the metal mask that a pixel unit of a smaller size can be produced under the consideration of process condition and the production of the high resolution OLED display can be achieved.

It should be understood that FIGS. 8 (a)-8 (c) only show three kinds of pixel structures for examples. Actually, the pixel units in the odd row and the pixel units in the even row can be interchanged. FIG. 10 is a schematic diagram illustrating a metal mask 60B of the blue sub pixel corresponding to the pixel structure as shown in FIGS. 8 (a)-8 (c), where the location of the openings are used to form the blue sub pixels. It should be understood that FIG. 10 only shows the arrangement of the opening of the metal mask of the blue sub pixel, while the area of the opening and the specific location of the opening in the metal mask are made based on actual pixel structures.

Take the blue sub pixel for instance. It can be seen that the spaces between openings in the metal mask can be enlarged due to the specific arrangement of the pixel unit of the present disclosure and the specific arrangement of the blue sub pixel, so as to solve the problem of Slit Mode and Slot Mode in the prior art.

In one embodiment, when the openings of the blue sub pixels in the even row are located in the middle of the openings of two adjacent blue sub pixels in adjacent two odd rows, the distances between the openings B in the metal mask 60B are widest, as shown in FIG. 12.

Figure 13A:
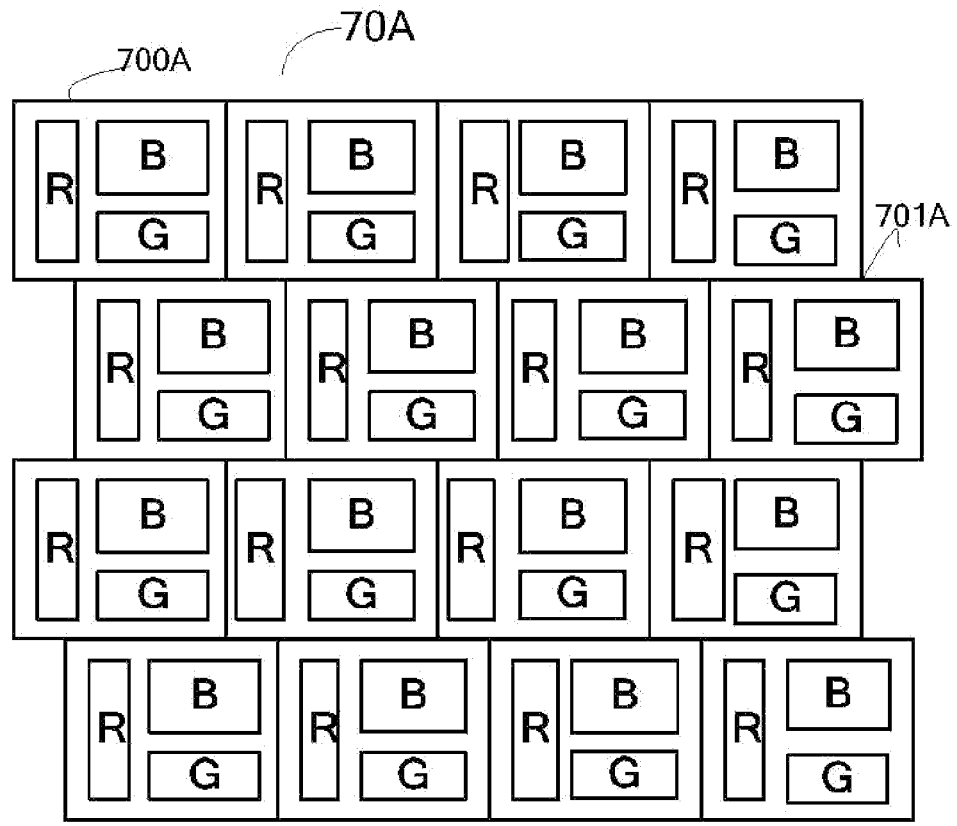
FIGS. 13 (a)-(c) are schematic diagrams illustrating pixel structures according to another embodiment of the present disclosure.
Figure 13B:
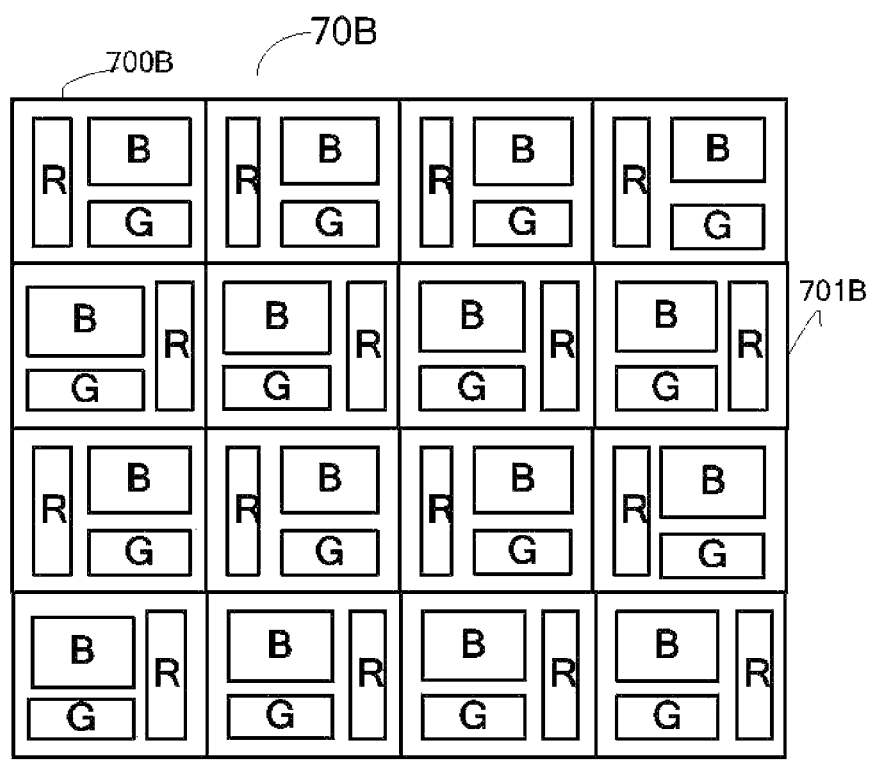
Figure 13C:
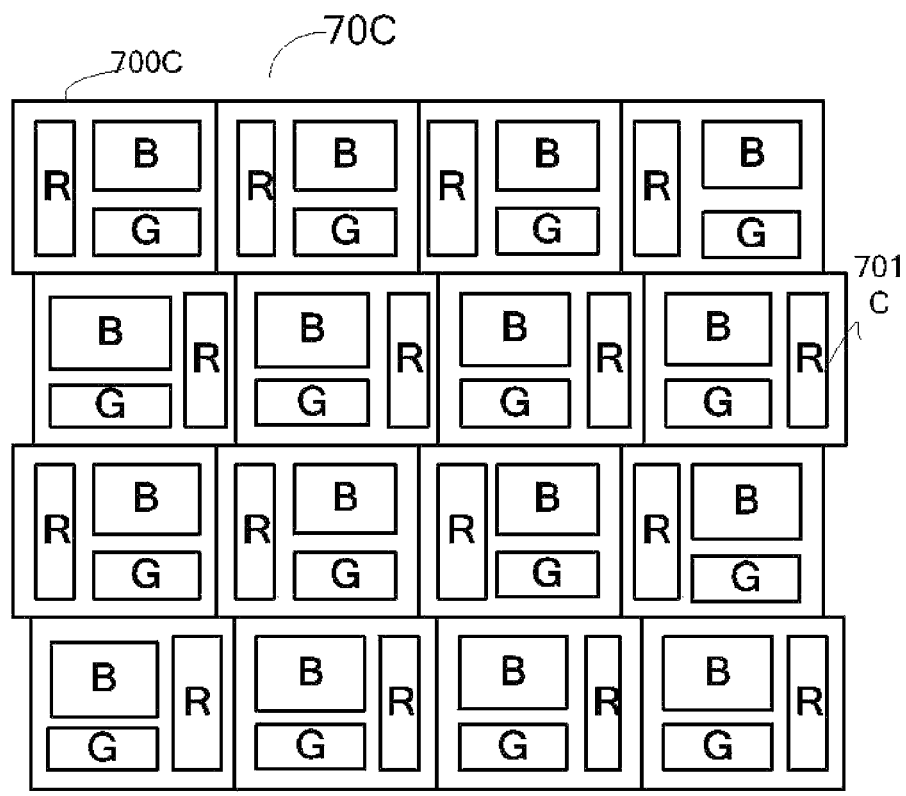

FIGS. 13 (a)-(c) are schematic diagrams illustrating pixel structures 70A-70C according to another embodiment modified from the embodiment as shown in FIG. 8 (a) 8 (c).

Wherein, the different from the pixel structures as shown in FIG. 8 (a) 8 (c) is that the blue sub pixel and the green sub pixel are lined up along one side of the red sub pixel.

In one embodiment, the area of the blue sub pixel is larger than that of the red sub pixel or the green sub pixel.

In one embodiment, the red, green and blue three sub pixels in the pixel units 500C or 501C can be squares, rectangles or other shapes.

In one embodiment, the red sub pixel has a shape of rectangle, and the blue sub pixel and the green sub pixel are aligned along the long side of the red sub pixel.

In one embodiment, the length of the long side of the red sub pixel is larger than two-thirds of the side length of the pixel unit.

In one embodiment, the area of the blue sub pixel and that of the green sub pixel are the same.

In one embodiment, the opening area of the blue sub pixel is about twice as that of the red sub pixel or green sub pixel.

In one embodiment, the area of the blue sub pixel is less than half of the area of the pixel unit 500C or 501C.

Similar to some embodiments described above, same sub pixels in adjacent two rows can be arranged in dislocation in a horizontal direction by arranging the pixel unit groups in adjacent two rows to be offset by a first distance in the horizontal direction, as shown in FIG. 13 (a), flipping the pixel units in the odd row (or even row) horizontally to 180° to form the pixel units in the even row (or odd row), as shown in FIG. 13 (b), or arranging the pixel unit groups in adjacent two rows to be offset by a second distance in the horizontal direction based on the pixel structure as FIG. 13 (b), as shown in FIG. 13 (c).

Thus, the pixel structures as shown in FIG. 13 (a)-(c) enlarge the distance between the same sub pixels and the distances between corresponding openings of the sub pixels in the metal mask can be enlarged when making the pixel structure, so as to achieve the production of the high resolution OLED display.

Figure 14A:
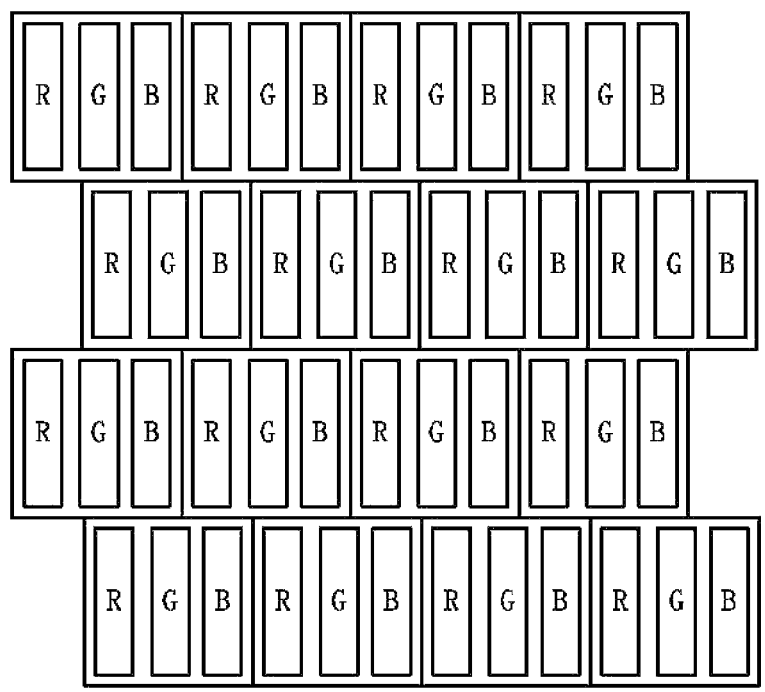
FIGS. 14 (a)-(c) are schematic diagrams illustrating pixel structures according to a further embodiment of the present disclosure.
Figure 14B:
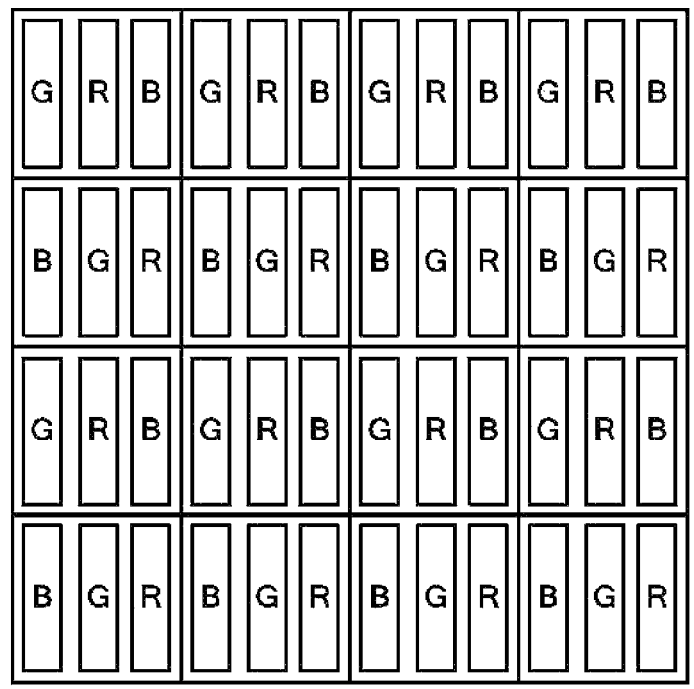
Figure 14C:
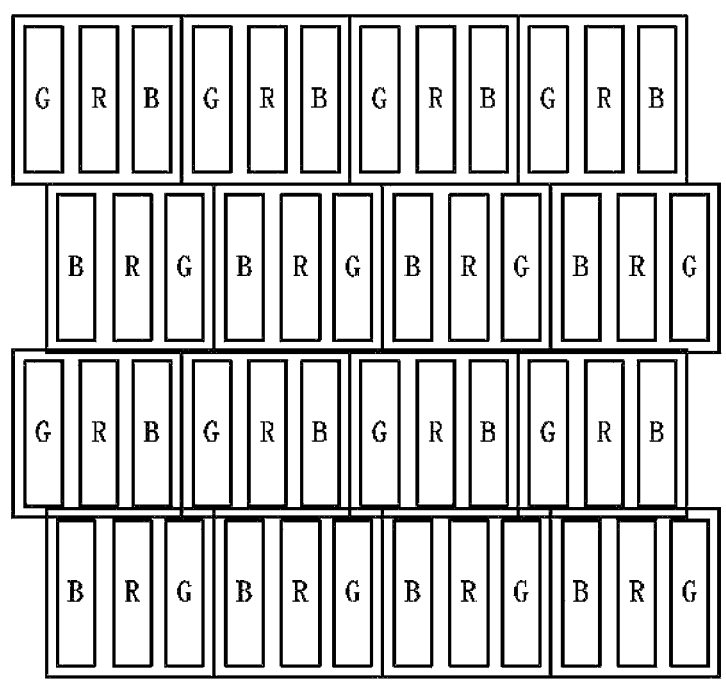

FIGS. 14 (a)-(c) are schematic diagrams illustrating pixel structures 80A-80C according to a further embodiment of the present disclosure. The pixel units in the rows can be arranged side-by-side, as show in the figure.

FIG. 14 (a) shows a pixel structure that the pixel units in the odd row and the even row are arranged in a same order, where the pixel unit group in the even row is arranged to be offset by a distance with respect to the pixel unit group in the odd row in a horizontal direction.

The scope of the offset distance makes the same sub pixels in adjacent two rows be arranged in dislocation, similar to the first embodiment.

FIG. 14 (b) shows a structure that the sub pixels in the pixel unit 500A of the pixel unit group in the odd row and the sub pixels in the pixel unit 501A of the pixel unit group in the even row are arranged in different orders.

Namely, if the arrangement of the sub pixels in the pixel unit in the odd row is B, R and G the arrangement of the sub pixels in the pixel unit in the even row is R, G and B or E B and R. On the one hand, the left and right boundaries of the pixel units of the pixel unit group in the odd row and the even row can be aligned that the pixel units in the odd row and the even row are aligned on the left and right edges of the display to better use of the area to achieve a better display effect. Meanwhile, the same sub pixels in adjacent two rows are arranged in dislocation due to different arrangements of the same sub pixels in the pixel units in the even row and those in the odd row, so as to enhance the strength of the metal mask and achieve the production of the high resolution OLED display mentioned in the above embodiments.

On the other hand, because the arrangements of the sub pixels in pixel units in the even rows are the same, and the arrangements of the sub pixels in pixel units in the odd rows are the same, such regular arrangement structure makes the production of TFT drive back-planes and the design of corresponding drive circuits easier. On the contrary, if the arrangements of the pixels in the odd rows and the even rows are irregular or arranged in a complicated order, complex designs of TFT back-plane and drive circuit are needed to display wanted images.

In one embodiment, as shown in FIG. 14 (b), the length of the red sub pixels R and the green sub pixels G in the pixel units of the pixel unit group in the odd row and the red sub pixels R and the green sub pixels G in corresponding pixel units in the even row is shorter than that of the blue sub pixel (not shown). The pixel structure can widen the distance between the corresponding openings of the sub pixels in the metal mask to enhance the strength of the metal mask and improve the resolution of the OLED display mentioned in the above embodiments.

FIG. 14 (c) shows a pixel structure that the unit pixel group in the even row is arranged to be offset by a distance in a horizontal direction based on the pixel unit structure as shown in FIG. 14 (b).

In addition, the present disclosure also provides an OLED display using the above pixel structures.

It can be understood that the pixel unit group can be arranged to be offset by a distance to the left and also can be arranged to be offset by a distance to the right, and the scope of the offset distance makes the sub pixels in adjacent two rows be arranged in dislocation.

Similar to the above embodiments, the arrangement as shown in FIG. 14 also can achieve the opening effect of the metal mask of the present disclosure.

The above embodiments are chosen and described in order to explain the principles of the present disclosure and their practical application so as to activate others skilled in the art to utilize the present disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A pixel structure for OLED display, comprising a plurality of rows of pixel unit groups, wherein each pixel unit group comprises a plurality of pixel units arranged repeatedly in sequence, each pixel unit comprises a first sub pixel, and a second sub pixel and a third sub pixel lined up along one side of the first sub pixel, and the arrangement of the first sub pixel, the second sub pixel and the third sub pixel of the pixel unit in each even row of the plurality of rows of pixel unit groups is formed by flipping the pixel unit in any odd row of the plurality of rows of pixel unit groups horizontally by 180°, wherein a vertical center line of horizontal spacing between the first sub pixel and a closest sub pixel thereto of the second sub pixels and third sub pixels does not overlap with a vertical center line of the pixel unit, and the vertical center line of horizontal spacing is positioned on the one side of the vertical center line of the pixel unit with the first sub pixel, and wherein the pixel unit group in the even row is arranged to be offset by a first distance with respect to the pixel unit group in the odd row in a horizontal direction, so that the first sub pixel of one of the pixel units in the even row is adapted to be positioned in a position with an equal distance from first sub pixels, respectively, in two adjacent pixel units in an adjacent odd row.

2. The pixel structure of claim 1, wherein the first sub pixel, the second sub pixel and the third sub pixel are rectangles.

3. The pixel structure of claim 1, wherein the pixel unit has a shape of square, the first sub pixel has a shape of rectangle, the second sub pixel and the third sub pixel are aligned vertically along a long side of the first sub pixel, and the length of the long side of the first sub pixel is larger than two-thirds of a side length of the pixel unit.

4. The pixel structure of claim 3, wherein an area of the first sub pixel is larger than that of the second sub pixel and that of the third sub pixel, and is smaller than half of an area of the pixel unit.

5. The pixel structure of claim 4, wherein the area of the first sub pixel is twice as that of at least one of the second and third sub pixels.

6. The pixel structure of claim 4, wherein the first sub pixel is a blue pixel, the second sub pixel is a red pixel and the third sub pixel is a green pixel.

7. The pixel structure of claim 3, wherein an area of the second sub pixel or the third sub pixel is larger than an area of each of the remaining two sub pixels.

8. The pixel structure of claim 7, wherein the area of the second sub pixel or the third sub pixel is twice as that of at least one of the remaining two sub pixels.

9. The pixel structure of claim 7, wherein the second sub pixel or the third sub pixel is a blue sub pixel, and the remaining two sub pixels are a red sub pixel and a green sub pixel.

10. A metal mask configured for making sub pixels in a pixel structure according to claim 1, comprising a substrate comprising a plurality of openings arranged in turn in rows and columns configured to form the sub pixel, wherein the openings in an even row and the openings in an odd row are arranged in dislocation in a horizontal direction.

11. The metal mask of claim 10, wherein, distances from an opening in an even row to two adjacent openings in an odd row adjacent to the even row are the same.

12. An OLED display, wherein the display comprises the pixel structure of claim 1.

* * * * *